(12) United States Patent
Geis et al.

(10) Patent No.: US 11,152,483 B2
(45) Date of Patent: Oct. 19, 2021

(54) DOPED ENCAPSULATION MATERIAL FOR DIAMOND SEMICONDUCTORS

(71) Applicants: Massachusetts Institute of Technology, Cambridge, MA (US); Arizona Board of Regents on behalf of Arizona State University, Phoenix, AZ (US)

(72) Inventors: Michael Geis, Acton, MA (US); Joseph Varghese, Woburn, MA (US); Robert Nemanich, Scottsdale, AZ (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/573,187

(22) Filed: Sep. 17, 2019

(65) Prior Publication Data
US 2021/0083070 A1    Mar. 18, 2021

(51) Int. Cl.
| H01L 29/66 | (2006.01) |
| H01L 29/16 | (2006.01) |
| H01L 21/02 | (2006.01) |
| H01L 21/56 | (2006.01) |

(52) U.S. Cl.
CPC .... *H01L 29/66037* (2013.01); *H01L 21/0228* (2013.01); *H01L 21/02282* (2013.01); *H01L 21/56* (2013.01); *H01L 29/1602* (2013.01)

(58) Field of Classification Search
CPC ........... H01L 21/0228; H01L 21/02282; H01L 21/56; H01L 29/1602
See application file for complete search history.

(56) References Cited

U.S. PATENT DOCUMENTS

| 5,254,862 A * | 10/1993 | Kalyankjumar ........ H01L 29/45 257/192 |
| 5,350,944 A * | 9/1994 | Geis ...................... H01L 21/044 257/288 |
| 8,759,876 B2 | 6/2014 | Lu et al. |
| 9,922,791 B2 | 3/2018 | Koeck et al. |
| 10,121,657 B2 | 11/2018 | Koeck et al. |
| 10,418,475 B2 | 9/2019 | Chowdhury et al. |
| 10,704,160 B2 | 7/2020 | Koeck et al. |
| 2014/0319542 A1* | 10/2014 | Kalish ...................... H01B 1/04 257/77 |
| 2015/0187570 A1* | 7/2015 | Haider ................ H01L 21/0206 438/692 |

(Continued)

OTHER PUBLICATIONS

Aguado et al., "Catalytic Conversion of Polyolefins into Liquid Fuels over MCM-41: Comparison with ZSM-5 and Amorphous $SiO_2$—$Al_2O_3$;" Article in Energy & Fuels, vol. 11, No. 6; Nov. 1997; pp. 1225-1231; 7 Pages.

(Continued)

*Primary Examiner* — Vongsavanh Sengdara
(74) *Attorney, Agent, or Firm* — Daly, Crowley, Mofford & Durkee, LLP

(57) ABSTRACT

According to some embodiments, a method for stabilizing electrical properties of a diamond semiconductor comprises terminating a surface of a diamond with hydrogen (H) or deuterium (D) atoms and over-coating the surface of the diamond with an encapsulating material comprising metal oxide salt doped with one or more elements capable of generating negative charge in the metal oxide salt.

23 Claims, 10 Drawing Sheets

(56) References Cited

U.S. PATENT DOCUMENTS

| | | | |
|---|---|---|---|
| 2016/0043260 A1 | 2/2016 | Nemanich et al. | |
| 2018/0182805 A1* | 6/2018 | Park | H01L 31/02161 |
| 2018/0204702 A1 | 7/2018 | Koeck et al. | |
| 2018/0212026 A1 | 7/2018 | Fedynyshyn et al. | |
| 2018/0366568 A1 | 12/2018 | Huang | |
| 2020/0119207 A1 | 4/2020 | Holmes et al. | |
| 2020/0343344 A1 | 10/2020 | Koeck et al. | |
| 2020/0388850 A1* | 12/2020 | Park | H01M 4/139 |
| 2020/0403067 A1* | 12/2020 | Kalish | H01B 1/08 |

OTHER PUBLICATIONS

Akhan Semiconductor Inc., "The Technology—The Case for Wide Bandgap Semiconductors;" Retrieved from https://www.akhansemi.com/technology.html on Jun. 6, 2019; 8 Pages.

Corma, "Inorganic Solid Acids and Their Use in Acid-Catalyzed Hydrocarbon Reactions;" Article in Chemical Reviews, vol. 95, No. 3; May 1995; pp. 559-614; 56 Pages.

Crawford et al., "Thermally Stable, High Performance Transfer Doping of Diamond Using Transition Metal Oxides;" Article from Scientific Reports, No. 8; Published Feb. 20, 2018; 9 Pages.

Geis et al., "Chemical and Semiconducting Properties of $NO_2$-activated H-terminated Diamond;" Article from Diamond & Related Materials, vol. 84; Published Mar. 6, 2018; 9 Pages.

Geis et al., "Progress Toward Diamond Power Field-Effect Transistors;" Article in Physica Status Solidi, vol. 215, No. 22; Nov. 2018; 14 Pages.

Hirama et al., "Diamond Field-Effect Transistors with 1.3A/mm Drain Current Density by $Al_2O_3$ Passivation Layer;" Japanese Journal of Applied Physics, vol. 51; Published Aug. 9, 2012; 5 Pages.

Hirama et al., "Spontaneous Polarization Model for Surface Orientation Dependence of Diamond Hole Accumulation Layer and its Transistor Performance;" Article in Applied Physics Letters, vol. 92; Published Mar. 19, 2008; 3 Pages.

Hoffman et al., "Electrochemical Hydrogen Termination of Boron-doped Diamond;" Article in Applied Physics Letters, vol. 97; Published Aug. 4, 2010; 3 Pages.

Hu et al., "A New Sol-gel Route to Prepare Dense $Al_2O_3$ Thin Films;" Article in Ceramics International, vol. 42; Published Jul. 27, 2016; 5 Pages.

Johnson, "Diamond-based Semiconductors Take a Step Forward;" Retrieved from https://spectrum.ieee.org/; Published Jun. 1, 2016; 2 Pages.

Kardys, "High Performance Diamond Semiconductor Devices Coming Soon!—AKHAN's Miraj Diamond® Technology Granted Key Patents and Trademarks;" Article from Electronics 360 (https://electronics360.globalspec.com/); Published May 31, 2018; 2 Pages.

Khan, "Moore's Law and Moving Beyond Silicon: The Rise of Diamond Technology;" Article Retrieved from https://www.wired.com/insights/2015/01/the-rise-of-diamond-technology/; Published on Jan. 30, 2015; 6 Pages.

Marczewski et al., "Superacid Properties of $Al_2O_3$—$SbF_5$ Catalytic System;" Article from the Journal of Molecular Catalysis A: Chemical, vol. 97, Issue 2; Published Apr. 3, 1995; pp. 101-110; 10 Pages.

Mitchell, "Diamonds Vie to Replace Silicon as Next Semiconductor Material;" Article Retrieved from https://www.allaboutcircuits.com; Published Jan. 28, 2017; 5 Pages.

Nakabayashi, "Properties of Acid Sites on $TiO_2$—$SiO_2$ and $TiO_2$—$Al_2O_3$ Mixed Oxides Measured by Infrared Spectroscopy;" Article from Bulletin of the Chemical Society of Japan, vol. 65, No. 3; Jan. 1992; pp. 914-916; 3 Pages.

Nanowerk, "Diamonds—the Ultimate Semiconductors;" Article Retrieved from https://www.nanowerk.com/nanotechnology-news/newsid=45214.php; Article Published Nov. 29, 2016; 10 Pages.

Sabu et al., "A Comparative Study on the Acidic Properties and Catalytic Activities on $TiO_2$, $SiO_2$, $Al_2O_3$, $SiO_2$—$Al_2O_3$, $SiO_2$—$TiO_2$, $Al_2O_3$—$TiO_2$, and $TiO_2$—$SiO_2$—$Al_2O_3$;" Article from Bulletin of the Chemical Society of Japan, vol. 64, No. 6; Jul. 16, 1990; pp. 1920-1925; 6 Pages.

Sato et al., "High Hole Current Achievement of Hydrogen-Terminated Diamond MOSFETs Coated with Poly-tetra-fluoro-ethylene;" Conference Paper from Extended Abstracts of the 2010 International Conference on Solid State Devices and Materials; Sep. 2010; pp. 908-909; 2 Pages.

Satsuma et al., "Determination of the Acid Strength of Binary Oxide Catalysts Using Temperature-Programmed Desorption of Pyridine;" Article from the Bulletin of the Chemical Society of Japan; Dec. 12, 1996; pp. 1311-1317; 7 Pages.

Tsao et al., "Ultrawide-Bandgap Semiconductors: Research Opportunities and Challenges;" Article from Advanced Electronic Materials; Dec. 4, 2017; 49 Pages.

Verona et al., "Influence of Surface Crystal-orientation on Transfer Doping of $V_2O_5$/H-terminated Diamond;" Article from Applied Physics Letters, vol. 112; Published May 1, 2018; 5 Pages.

Yu et al., "A High Frequency Hydrogen-Terminated Diamond MISFET with $f\tau/f$max of 70/80 GHz;" Article from IEEE Electron Device Letters, vol. 39, No. 9; Sep. 2018; 4 Pages.

U.S. Appl. No. 16/844,907, filed Apr. 9, 2020, Varghese et al.

Cappelluti, et al., "Investigating the Properties of Interfacial Layers in Planar Schottky Contacts on Hydrogen-Terminated Diamond Through Direct Current/Small-Signal Characterization and Radial Line Small-Signal Modelling;" Applied Physics Letters, vol. 106; Mar. 12, 2015; 6 Pages.

Hewett, et al., "Specific Contact Resistance Measurements of Ohmic Contacts to Semiconducting Diamond;" Journal of Applied Physics, vol. 107; Jun. 4, 1998; 7 Pages.

Macdonald, et al., "Performance Enhancement of $Al_2O_3$/H-Diamond MOSFETs Utilizing Vacuum Annealing and $V_2O_5$ as a Surface Electron Acceptor;" IEEE Electron Device Letters, vol. 39, No. 9; Sep. 2018; 4 Pages.

Nakanishi, et al., "Formation of Ohmic Contacts to p-type Diamond Using Carbide Forming Metals;" Journal of Applied Physics, vol. 76; Aug. 17, 1998; 7 Pages.

U.S. Non-Final Office action dated Jun. 10, 2021 for U.S. Appl. No. 16/844,907; 13 pages.

* cited by examiner

DOPED ENCAPSULATION MATERIAL FOR DIAMOND SEMICONDUCTORS

STATEMENT REGARDING FEDERALLY SPONSORED RESEARCH

This invention was made with Government support under Grant No. FA8702-15-D-0001 awarded by the U.S. Air Force. The Government has certain rights in the invention.

FIELD OF THE INVENTION

This disclosure relates generally to a diamond semiconductor having a doped encapsulating material to provide an electrically stable conductive layer.

BACKGROUND

As is known in the art, semiconducting diamond can provide an order of magnitude increase in power handling over other semiconductor materials, such as silicon (Si), gallium arsenide (GaAs), and gallium nitride (GaN). This is made possible by diamond's higher thermal conductivity and a higher breakdown voltage compared with these materials.

A diamond field-effect transistor (FET) can be made by forming a p-type surface conductive layer on the diamond surface. One approach to forming the p-type surface conductive layer is to terminate the diamond surface with hydrogen (H) atoms and then over-coat the H-terminated surface with a material that contains negative charge. Impressive current, voltage and operational frequencies have been demonstrated with such surface conductive FETs. However, with existing diamond FETs, the conductive surface layer may be unstable, causing performance to degrade in a matter of hours or days.

SUMMARY

According to one aspect of the disclosure, a method for stabilizing electrical properties of a diamond semiconductor comprises: terminating a surface of a diamond with hydrogen (H) or deuterium (D) atoms; and over-coating the surface of the diamond with an encapsulating material comprising metal oxide salt doped with one or more elements capable of generating negative charge in the metal oxide salt.

In some embodiments, the metal oxide salt comprises aluminum oxide ($Al_2O_3$) and the one or more elements capable of generating negative charge comprise at least one of silicon dioxide ($SiO_2$) and/or zirconium oxide ($ZrO_2$). In certain embodiments, the metal oxide salt comprises aluminum phosphate ($AlPO_4$) and the one or more elements capable of generating negative charge comprise at least one of silicon dioxide ($SiO_2$) and/or zirconium oxide ($ZrO_2$). In particular embodiments, the metal oxide salt comprises boron oxide ($B_2O_3$) and the one or more elements capable of generating negative charge comprise at least one of silicon dioxide ($SiO_2$) and/or zirconium oxide ($ZrO_2$). In some embodiments, the encapsulating material comprises at least one of aluminum (Al) or boron (B), wherein, in the encapsulating material, the concentration of Al or B is less than that of the or more elements capable of generating negative charge.

In certain embodiments, over-coating the surface of the diamond with the encapsulating material comprises using an evaporation process. In particular embodiments, the encapsulating material has a thickness of less than 2 nm. In some embodiments, the evaporation process comprises: mounting the diamond to a vacuum system; heating the diamond to a temperature greater than 100° C. Over-coating the surface of the diamond with the encapsulating material can comprise: coating the surface of the diamond with at least one of Al or B using an evaporation technique; adding, to the surface of the diamond, the one or more elements capable of generating negative charge; and annealing the diamond in an oxidizing atmosphere to oxidize the Al or B and the one or more elements capable of generating negative charge. In some embodiments, adding the one or more elements capable of generating negative charge occurs before coating the surface of the diamond. In certain embodiments, adding the one or more elements capable of generating negative charge occurs during coating of the surface of the diamond.

In some embodiments, over-coating the surface of the diamond with the encapsulating material comprises using an atomic layer deposition (ALD) process. In certain embodiments, during the ALD process, the temperature of the diamond is increased from less than 300° C. to more than 350° C. In particular embodiments, the ALD process comprises: flowing argon (Ar) gas over the diamond; heating the diamond to a temperature of between 100 to 500 degrees Celsius; injecting alternating gas pulses into the argon gas; cooling the diamond semiconductor under argon gas; and annealing the diamond in an atmosphere of $N_2$ or $N_2$ and $H_2$.

In some embodiments, the alternating gas pulses comprise: water ($H_2O$); an aluminum oxide ($Al_2O_3$) precursor; and a silicon dioxide ($SiO_2$) precursor. In particular embodiments, the Al precursor comprises trimethyl aluminum (Al$(CH_3)_3$)). In certain embodiments, the $SiO_2$ precursor comprises tris(tert-butoxy)silanol (($OC(CH_3)_3)_3SiOH$). In some embodiments, the alternating gas pulses comprise a boron oxide ($B_2O_3$) precursor. In certain embodiments, the alternating gas pulses comprise a zirconium dioxide ($ZrO_2$) precursor. In particular embodiments, the alternating gas pulses comprise silicon dioxide ($SiO_2$) and a zirconium dioxide ($ZrO_2$) precursor.

In some embodiments, one or more steps of the ALD process occur within an ALD chamber, before placing the diamond in the ALD chamber, precoating the chamber with elements capable of generating negative charge, $SiO_2$ or $ZrO_2$, using a $SiO_2$ precursor or a $ZrO_2$ precursors, and an oxygen ($O_2$) plasma. Residual chemistry in the ALD system from the precoating will be incorporated in to the $Al_2O_3$ or $B_2O_3$ film.

In certain embodiments, over-coating the surface of the diamond with the encapsulating material comprises using a sol-gel spin coating process. In some embodiments, the sol-gel spin coating process comprises: mixing an organic aluminum salt solution with a silicon ($SiO_2$) precursor solution; spin-coating the mixed solution onto the surface of the diamond with a surfactant to ensure wetting of the diamond surface with the sol-gel; heating the sol-gel to a temperature greater than 100° C.; annealing the diamond to drive off the organic components in the sol-gel coating.

In particular embodiments, the method comprises over-coating the encapsulating material with a dielectric layer.

According to another aspect of the present disclosure, a diamond semiconductor comprises: a surface terminated with hydrogen (H) or deuterium (D) atoms; and an encapsulating layer disposed over the surface of the diamond, the encapsulating layer comprising metal oxide salt doped with one or more elements capable of generating negative charge.

BRIEF DESCRIPTION OF THE DRAWINGS

The concepts, structures, and techniques sought to be protected herein may be more fully understood from the following detailed description of the drawings.

It should be noted that the drawings are not necessarily to scale, or inclusive of all elements of a system, emphasis instead generally being placed upon illustrating the concepts, structures, and techniques sought to be protected herein.

DETAILED DESCRIPTION

Figure 1:
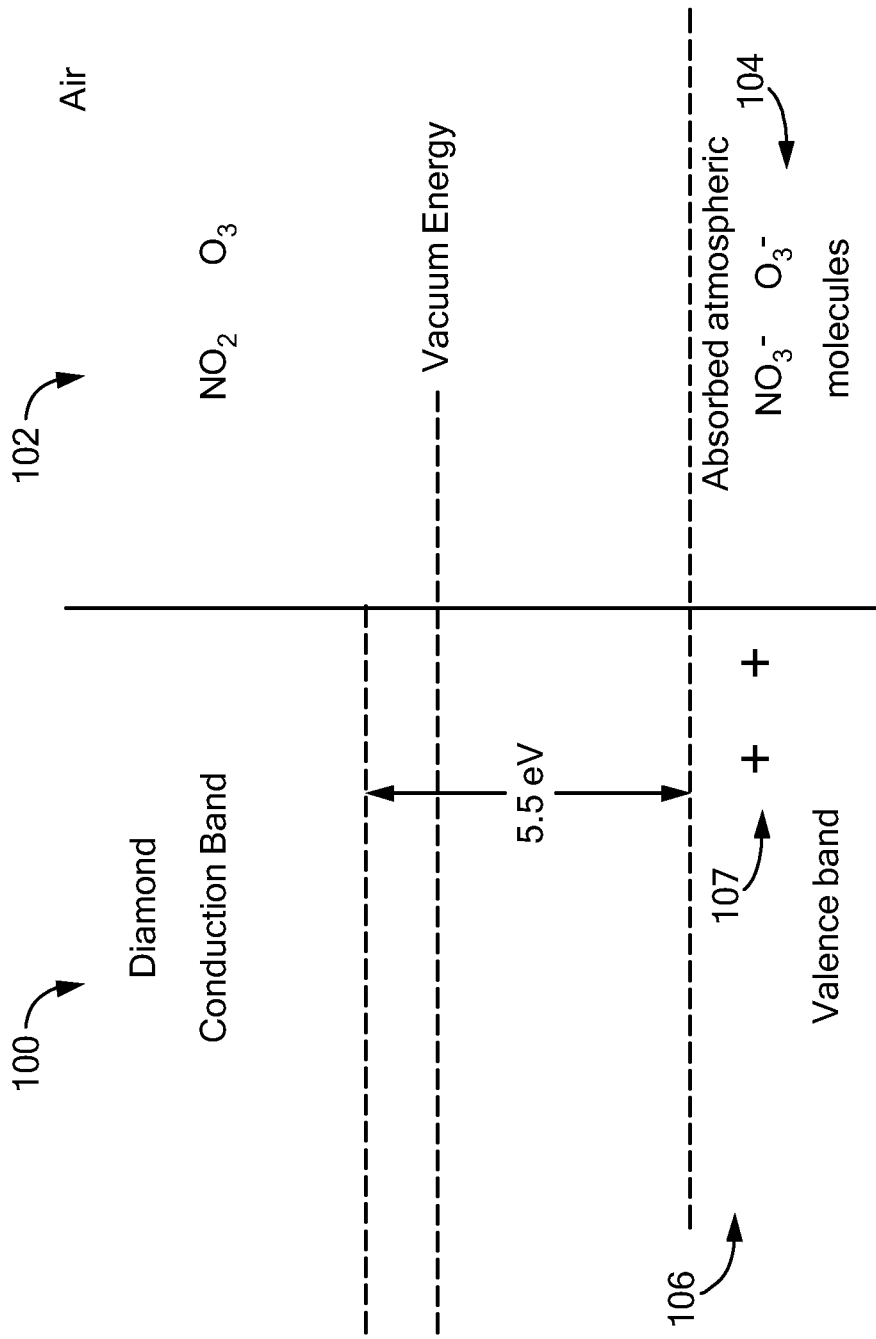
FIG. 1 is a diagram illustrating a band gap for an H-terminated diamond surface.

Different techniques for enhancing surface diamond conductivity have been proposed. FIG. 1 shows diamond's energy levels and surface chemistry 100 in an example using absorbent molecules 102, such as $NO_2$ and $O_3$. As shown in FIG. 1, absorbed chemicals in the atmosphere have electron affinities 104 below that of the valance band of diamond 106 and form negative ions and mobile positive charges (i.e. holes) 107 in diamond's valence band. While this approach has been shown to achieve FET drain currents up to approximately 0.7 A mm$^{-1}$ and a transition frequency ($f_T$) of around 75 GHz, such devices are unstable and can degrade in a matter of hours or days.

Figure 2:
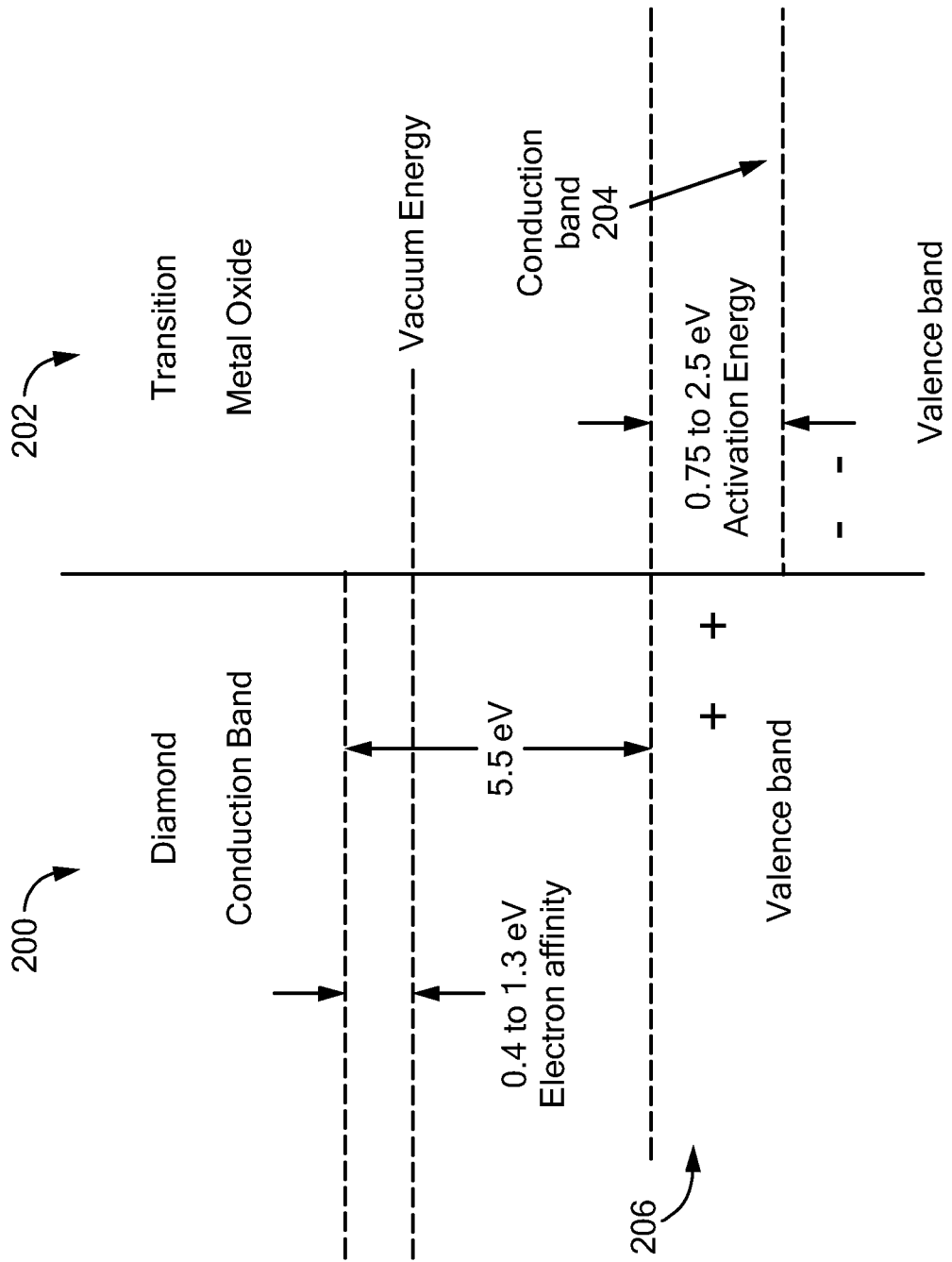
FIG. 2 is a diagram illustrating a band gap for an H-terminated diamond surface coated with a transition metal oxide.

FIG. 2 shows diamond's energy levels and surface chemistry 200 in an example using transition metal oxides 202 (e.g., $WO_2$, $MoO_3$, or $V_2O_5$) on the diamond surface to reduce surface resistance. As shown, transition metal oxides have a conduction band 204 below the valence band 206 of diamond. As a result, electrons leave diamond's valance band for the oxides, forming valence band holes in the diamond and reducing surface resistance. However, FETs using transition metal oxides may have unacceptably low drain currents (e.g., less than 0.25 A mm$^{-1}$) and may electrochemically degrade under the high electric fields associated with FETs. Another approach that has been tried is atomic layer deposition (ALD) of $Al_2O_3$ on the diamond surface. While this technique may result in improved stability, it may result unacceptably low drain currents (e.g., less than 0.3 A mm$^{-1}$).

It is recognized herein that previous approaches to producing diamond semiconductors have resulted in conductive surfaces that are either too unstable or insufficiently conductive for practical use. The structures and techniques described herein can be used to produce diamond semiconductors that have relatively low resistance (e.g., 1.5 to 3 $k\Omega sq^{-1}$) and that are stable over a relatively long period of time (e.g., more than 120 days).

Embodiments of the present disclosure provide a doped encapsulating layer that maintains the integrity of the conductive layer by protecting the diamond surface while maintaining a stable negative charge. The structures and techniques disclosed herein can be applied to produce diamond semiconductor devices and components with stable electrical properties and capable of operating at high power and frequencies. A reduced and stable surface resistance allows for the fabrication of diamond FETs where they can replace gallium nitride (GaN) and aluminum gallium nitride (AlGaN) FETs currently used in power radio frequency (RF) amplifiers by virtue of diamond's higher break down voltage and thermal conductivity. Embodiments of the present disclosure may achieve surface conductivity of less than 1 $k\Omega sq^{-1}$ and, as such, may be suitable for use in power converters including high-power converters used in regional or national power grids.

Figure 3:
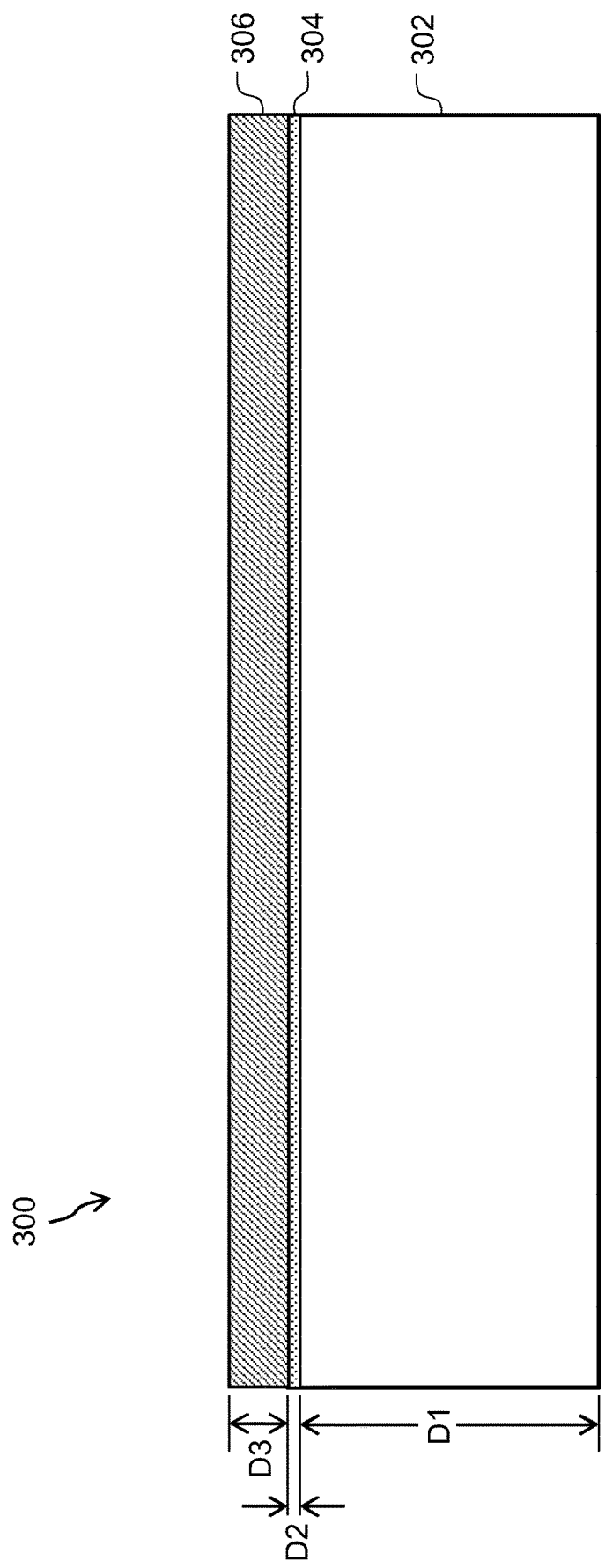
FIG. 3 is a side view diamond semiconductor structure having a doped encapsulating layer, according to some embodiments of the present disclosure.

Turning to FIG. 3, according to some embodiments of the present disclosure, a semiconductor structure 300 comprises a diamond substrate 302, an H-terminated layer 304, and an encapsulating layer 306 (sometimes referred to as an "overcoat" layer). Substrate 302 may comprise synthetic diamond having a thickness D1 in the range 10 to 500 μm.

The H-terminated layer 304 may correspond to a surface of the diamond substrate 302 terminated with hydrogen (H) or deuterium (D) atoms. The H-terminated layer 304 may be formed, for example, using an electrochemical process or an $H_2$ plasma exposure process. In some embodiments, H-terminated layer 304 may have a thickness D2 in the range one to two atomic layers.

The encapsulating layer 306 may include an impervious inert matrix doped with an element or compound that forms negative charge in the matrix. The inert matrix may be comprised of an oxide or a nitride, non-limiting examples of which include $SiO_2$, $Al_2O_3$, $TiO_2$, $ZrO_2$, $Si_3N_4$, or $Al_3N_4$. The dopant can include an atomic impurity (e.g., Si, Al, B, Ti, or Zr) or a molecular impurity (e.g., $BF_3$, $SbF_3$, or $MoO_3$) that forms negative ions in in the matrix. In some embodiments, the dopant material may include an aluminum-silicon oxide. In general, any element or molecule capable of generating negative charge can be used to dope the inert matrix.

It is appreciated herein that adding a dopant to the encapsulating layer 306 can protect the diamond surface from degradation and stabilize negative ions on the conductive diamond surface. In some embodiments, the materials used in the encapsulating layer may be selected based on their electron gettering properties. A material's electron gettering properties can be characterized by its Lewis acid strength, with more acidic materials generally have more "aggressive" electron gettering properties.

The encapsulating layer 306 can be formed using various different techniques, including evaporation, atomic layer deposition (ALD), or sol-gel spin coating. These techniques are discussed in detail below in the context of FIGS. 6A, 6B, and 6C. In some embodiments, encapsulating layer 306 may have a thickness D3 in the range 1 nm to 100 nm. In particular embodiments, such as for use in FETs, the encapsulating layer may have a thickness of about 20 nm.

It will be appreciated that the H-terminated layer 304 can act as a p-type conductive layer, while the encapsulating layer 306 maintains the integrity of the conductive layer by stabilizing its electrical properties while still allowing high power and high frequency operation. Accordingly, embodiments of the diamond semiconductor structure 300 may be suitable for use in various applications including but not limited to RF amplifiers, grid power converters, and other high-power and/or high-frequency applications.

Figure 4:
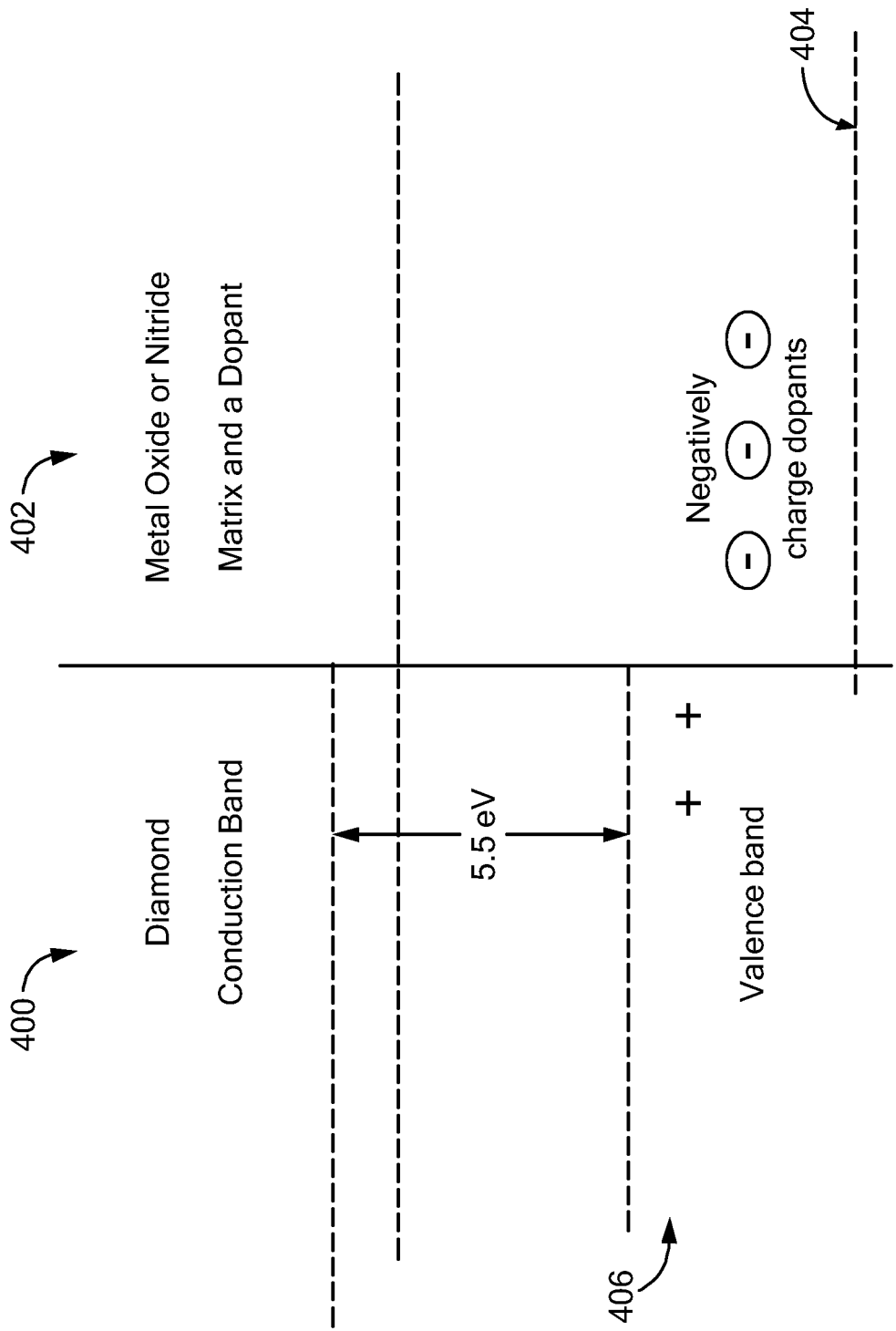
FIG. 4 is a diagram illustrating a band gap for an H-terminated diamond surface encapsulated with a doped matrix, according to some embodiments of the present disclosure.

FIG. 4 shows diamond's energy levels and surface chemistry 400 in an example using an inert matrix doped with atoms or compounds 402 that trap electrons from the diamond. The matrix may comprise an impurity capable of trapping electrons originating from diamond's valance band, thereby providing increased stability compared to existing diamond semiconductors. As shown in FIG. 4, the matrix valance band 404 is below that of diamond 406.

Figure 5:
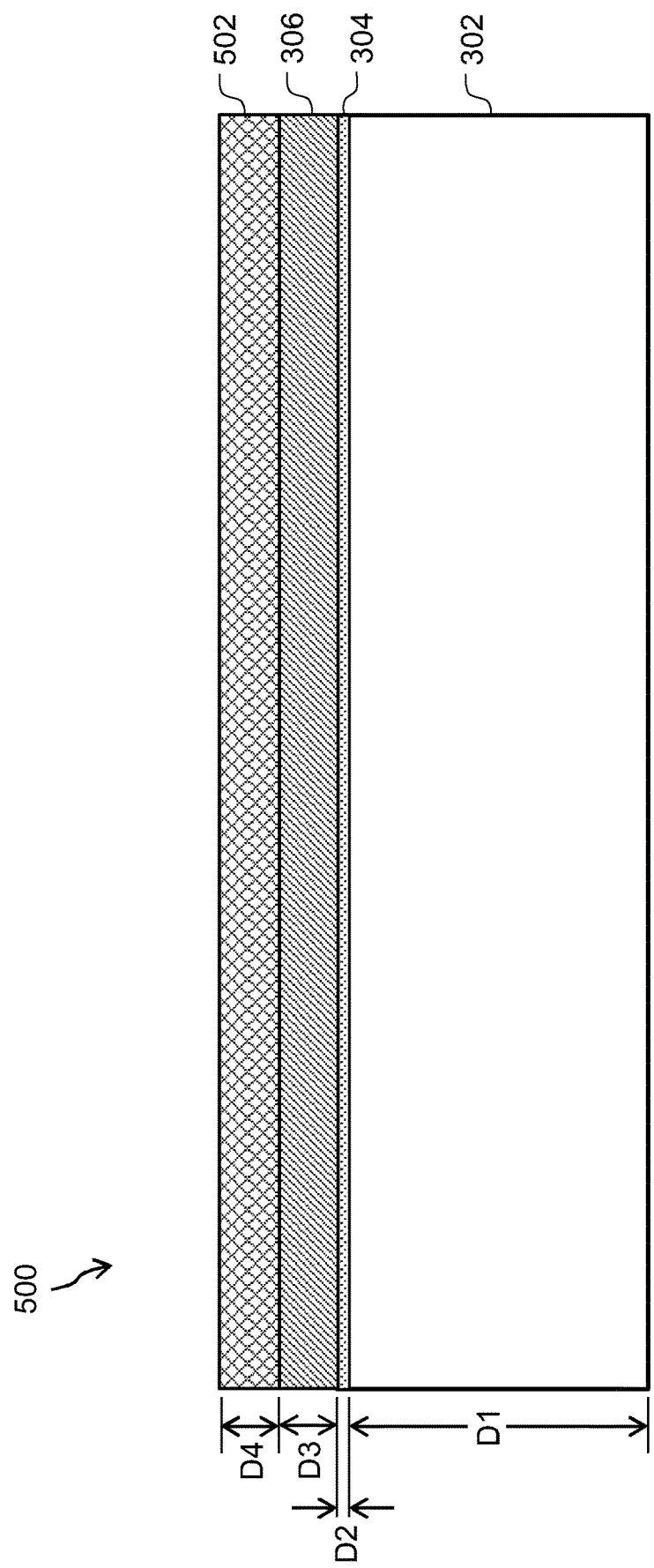
FIG. 5 is a side view of a diamond semiconductor structure having a doped encapsulating layer and a dielectric layer, according to some embodiments of the present disclosure.

Referring to FIG. 5, in which like elements of FIG. 3 are shown using like reference numbers, according to some embodiments of the present disclosure a semiconductor structure 500 may include a dielectric layer 502 disposed over the doped encapsulating layer 306. The dielectric layer 502 may be provided as any suitable dielectric material, including but not limited to a glass material or a plastic material. The dielectric layer 502 may provide insulation needed for high voltage applications. In some embodiments, dielectric layer 502 may have a thickness D4 in the range 100 nm to 20 μm.

FIGS. 6, 6A, 6B, and 6C show methods for forming diamond semiconductors having a doped encapsulating layer, according to some embodiments of the present disclosure. While the following discussion may, by way of example, refer to an aluminum oxide ($Al_2O_3$) matrix doped with silicon (Si), other elements or compounds can be used. For example, oxides such as $SiO_2$, $TiO_2$, $ZrO_2$ and nitrides such as $Si_3N_4$ and $Al_3N_4$ could be used as the inert matrix. In some embodiments, boron oxide ($B_2O_3$) can be used as the inert matrix.

Figure 6:
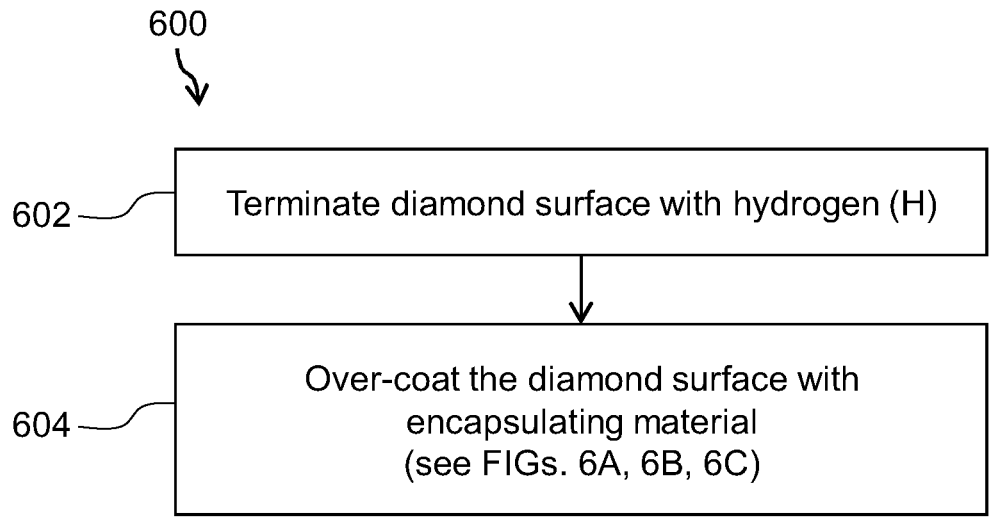
FIGS. 6, 6A, 6B, and 6C are flow diagrams showing methods for forming diamond semiconductors having a doped encapsulating layer, according to some embodiments of the present disclosure.

Referring to FIG. 6, a method 600 can begin at block 602 by terminating a surface of a diamond substrate with hydrogen (H) or deuterium. The terminating procedure may be done using, for example, an electrochemical process or an $H_2$ or $D_2$ plasma exposure process. At bock 604, the diamond surface can be over-coated with a doped matrix to form an encapsulating layer. The encapsulating layer can be formed using several different techniques, including evaporation, atomic layer deposition (ALD), and sol-gel spin coating as discussed below in the context of FIGS. 6A, 6B, and 6C, respectively.

Figure 6A:
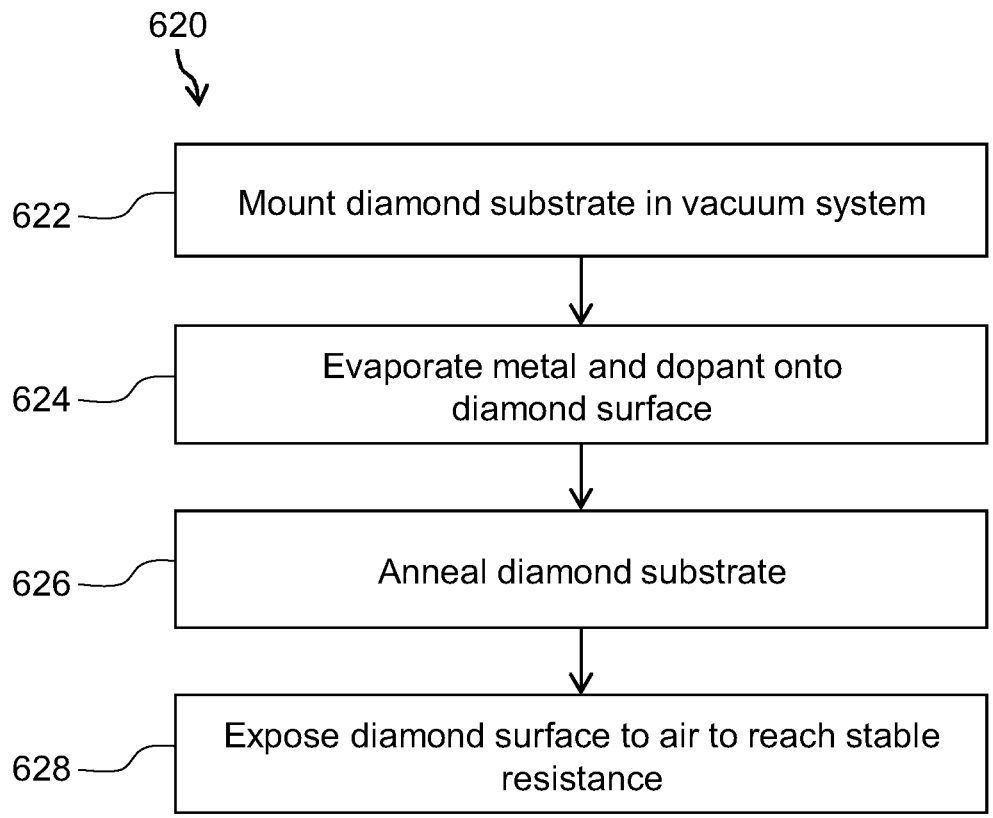

FIG. 6A shows a method 620 for over-coating the diamond surface using an evaporation technique. At block 622, the diamond substrate can be mounted in a vacuum system. In some embodiments, the vacuum system may have a pressure of less than $1 \times 10^{-6}$ Torr. The terminated diamond may be heated to a temperature sufficient to expel absorbent materials from the atmosphere. In some embodiments, the diamond may be heated to a temperature greater than 100° C. In some embodiments, the diamond may be heated to a temperature greater than 200° C.

At block 624, a quantity of metal is evaporated on the diamond surface at a given rate using an electron beam. In some embodiments, 2 nm of Al may be evaporated onto the diamond surface at a rate of 0.2 to 0.5 nm s−1. A quantity of dopant is then deposited at the same (or approximately the same) rate. This procedure may be repeated several times to achieve a desired material thickness. In some embodiments, the evaporation procedure may be repeated 4 times to obtain a material thickness of approximately 12 nm.

In some embodiments, the encapsulation layer (or "coating") has a thickness of less than 2 nm. In some embodiments, the dopant is added to the surface of the diamond before evaporating the metal. In other embodiment, the dopant is added during the evaporation process.

In some embodiments, the metal may be mixed with another material selected so that it does not inhibit or degrade the function of the metal oxide. In some embodiments, the additional material may comprise a layer of dielectric material.

At block 626, the diamond substrate may be removed from the vacuum system and annealed. The annealing process can include placing the diamond substrate on a hot plate (e.g., a plate having a temperature of around 250° C.) and exposed to air until the deposited layer, which in some embodiment is Al—Si, becomes clear. Additional annealing may be performed in a rapid-thermal-annealing oven. In some embodiments, the diamond can then be heated to 450° C. for about 1 minutes in flowing forming gas (e.g., 3% $H_2$ in $N_2$) to remove material absorbed from the atmosphere. The diamond may then be cooled in flowing forming gas (e.g., $N_2$) for about 5 minutes and then re-heated to 600° C. for about 1 min. The diamond may then be cooled to room temperature before being exposed to air. In some embodiments, the diamond may be annealed in an oxidizing atmosphere to oxidize the metal and the one or more elements capable of generating negative charge.

At block 628, the diamond substrate may be exposed to air for several hours or days (e.g., at least 48 hours) in order to achieve a stable surface resistance.

Figure 6B:
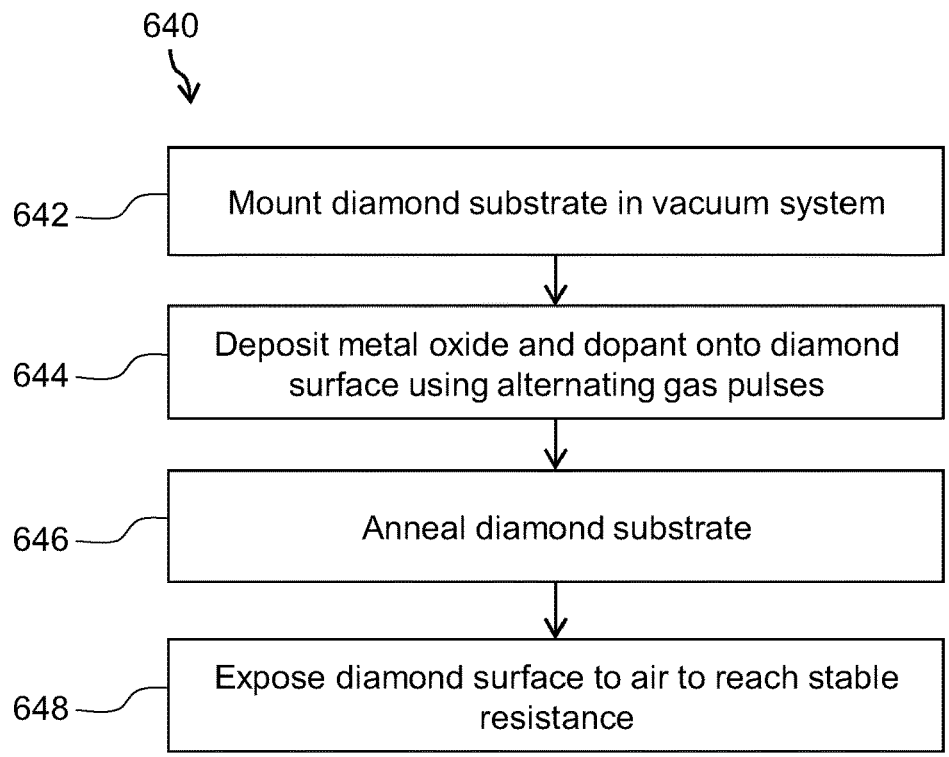

FIG. 6B shows a method 640 for over-coating the diamond surface using atomic layer deposition (ALD). At block 642, the diamond substrate can be mounted in a vacuum system under the same or similar conditions to those described above for the evaporation technique (FIG. 6A). In some embodiments, the vacuum system can be heated to a temperature between 250 and 450° C. during the ALD process.

At block 644, alternating gas pulses of $H_2O$, an Al precursor (e.g., trimethylaluminium ($Al(CH_3)_3$) or TMA), and a Si precursor (e.g., tris(tert-butoxy)silanol (($OC(CH_3)_3)_3SiOH$) or TBS) may be performed in the vacuum system containing the diamond substrate. In some embodiments, the deposition process starts with flowing a gas (e.g., Ar) over the diamond substrate. Pulses of gases may then be injected into the flowing gas in the following sequence: (1) a 60 ms pulse of $H_2O$; (2) a 4 s pause; (3) a 60 ms pulse of TMA; (4) a 4 s pause; (5) a 10 ms pulse of TBS; (6) a 20 s pause; (7) a 60 ms pulse of TMA; and (8) a 4 s pause. This initial sequence can be repeated several times, e.g., 10 times. In some embodiments, the initial sequence can be followed by a secondary sequence comprising: (1) a 60 ms pulse of H2O; (2) a 4 s pause; (3) a 60 ms pulse of TMA; and (4) a 4 s pause. The secondary sequence may be repeated several times (e.g., 190 times). In some embodiments, the sequence may be repeated such that, at the end of the ALD process, the encapsulated layer has a thickness between 1 nm and 100 nm. The diamond substrate may be allowed to cool, for example, using Ar at a temperature less than 200° C. before being exposed to air. In some embodiments, during the ALD process, the temperature of the diamond is increased from less than 300° C. to more than 350° C.

In some embodiments, the $H_2O$ may be replaced with an oxygen containing plasma. In some embodiments, the Al precursor may be replaced with a boron (B) precursor, such as trimethyl borate ($B(OCH_3)_3$). In some embodiments, the $SiO_2$ precursor may be replaced with or in addition to a zirconium dioxide ($ZrO_2$) precursor, such as zirconium(IV) tert-butoxide ($Zr(OC(CH_3)_3)_4$).

In some embodiments $SiO_2$ and or $ZrO_2$ is predeposited in the ALD system using their precursors and an oxygen plasma before the diamond substrates is placed in the ALD system. Once the diamond is placed in the ALD system only $Al_2O_3$ is deposited and the residual precursors from the predeposition dopes the $Al_2O_3$.

In some embodiments, the Al precursor may be replaced with a boron (B) precursor, such as trimethyl borate $(B(OCH_3)_3)$. In some embodiments, the Si precursor may be replaced with or in addition to a zirconium dioxide $(ZrO_2)$ precursor, such as zirconium(IV) tert-butoxide $(Zr(OC(CH_3)_3)_4)$.

At blocks 646 and 648, the coated diamond can then be annealed and stabilized using processes similar to those discussed above in the context of FIG. 6A.

Figure 6C:
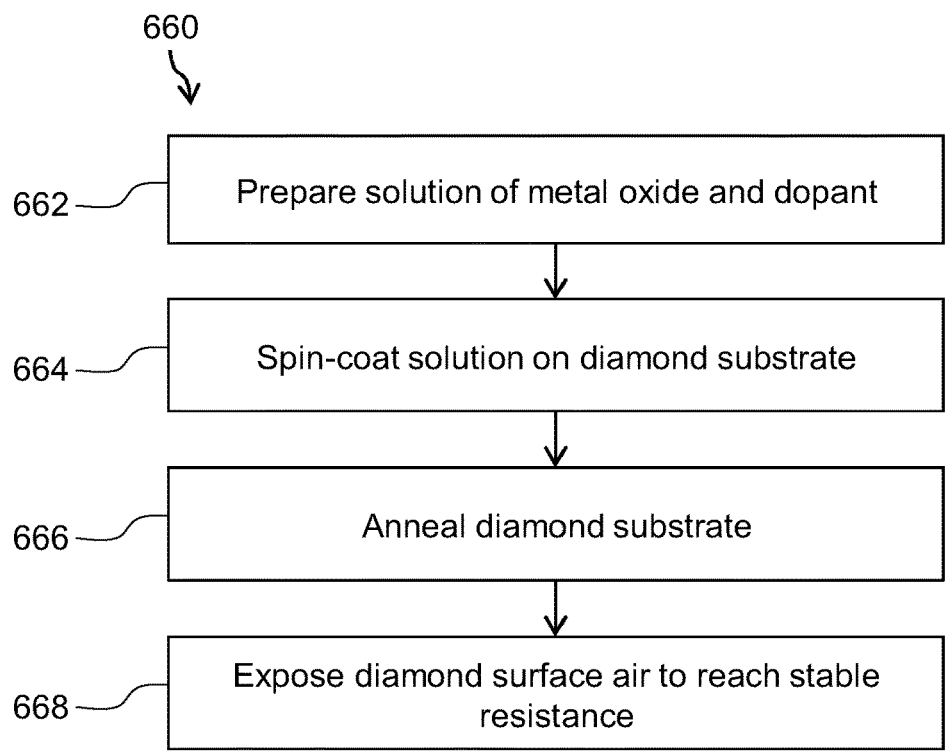

FIG. 6C shows a method 660 for over-coating the diamond surface using a sol-gel spin coating technique. At block 662, a solution of metal oxide and dopant is prepared. In some embodiments, a 0.33 molar solution of aluminumisopropoxide $(Al(OPri)_3)$ in 2-ethoxyethanol, acetic acid, and acetylacetone (AcAc) can be used as the Al source. In some embodiments, aluminum isopropoxide, $Al(OCH(CH_3)_2)_3$, is used as the Al source. To every 1 ml to the Al source solution, 0.01 ml of a $SiO_2$ precursor solution (e.g., tetraethyl orthosilicate $(Si(OCH_2CH_3)_4)$ or TOS) can be added just prior to the spin-coating.

In some embodiments, the $SiO_2$ solution may be replaced with a $ZrO_2$ precursor, such as zirconium(IV) tert-butoxide, $Zr(OC(CH_3)_3)_4$.

At block 664, the solution may be spin-coated on the diamond substrate, for example, at 3 k RPM for 60 s. In some embodiments, a surfactant may be used during the spin-coating to ensure wetting of the diamond surface with the sol-gel. The diamond substrate may then be heated, for example by placing it on a hot plate having a temperature of at least 100° C. for 60 s.

At blocks 666 and 668, the diamond substrate can be annealed and stabilized using processes similar to those discussed above in the context of FIG. 6A.

It is appreciated herein that, when using a spin coating procedure, it is important to avoid contaminating the inert matrix with alkali and alkali-earth metals (Li, Na, K, Mg, Ca, Sr, etc.) as their charge can compromise the negative charge in the encapsulating layer and reduce the hole concentration on the diamond surface. To avoid alkali-metal contamination, an organic sol-gel can be used to generate a smooth doped $Al_2O_3$ layer.

In some embodiments, the method of FIGS. 6, 6A, 6B, and/or 6C can be performed in full or in part by a robot system.

Figure 7:
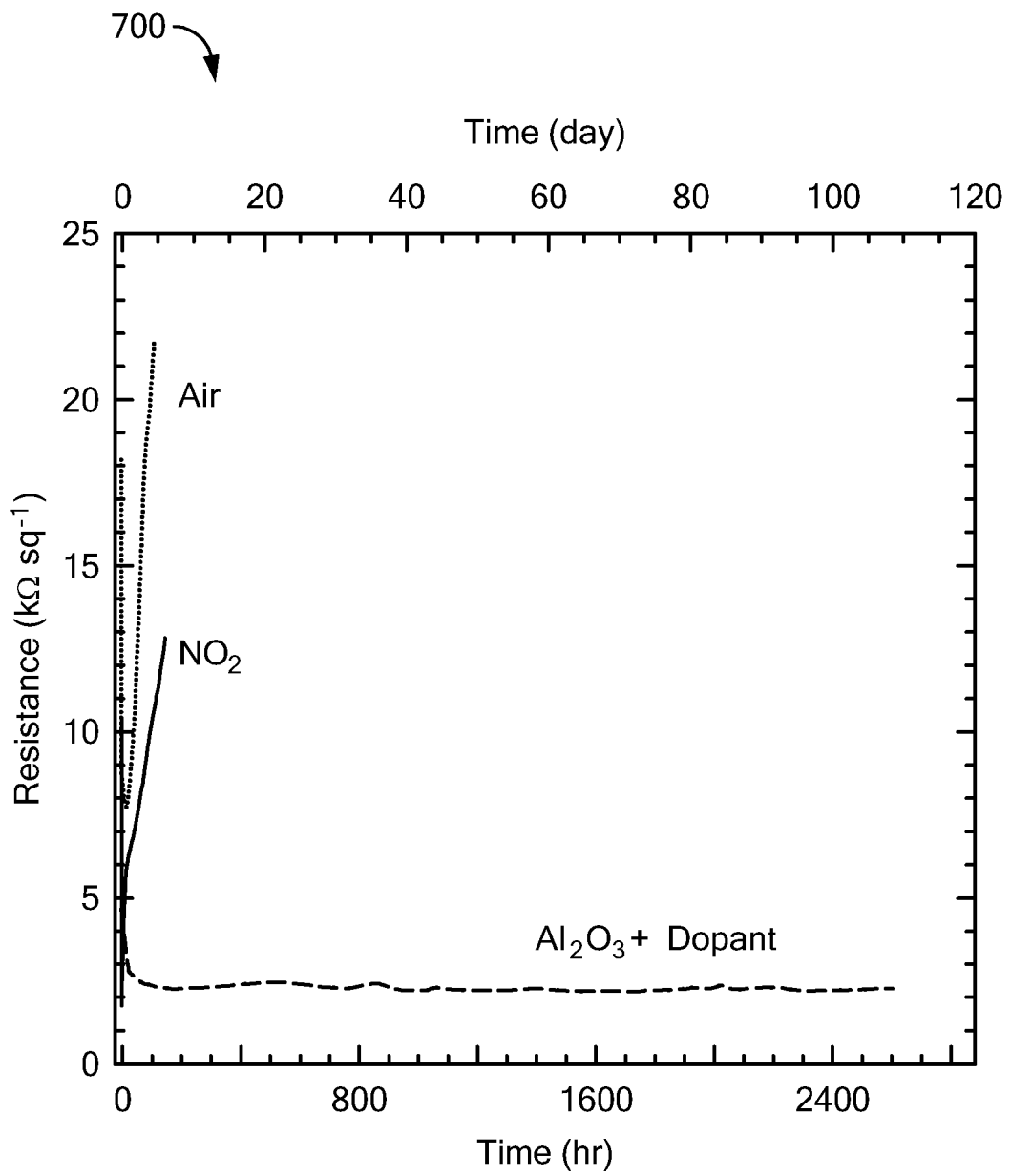
FIGS. 7, 8, and 9 are graphs showing electrical properties of diamond semiconductors according to the present disclosure.

FIG. 7 shows surface resistance as function of time for several techniques used to enhance the conductivity of H-terminated diamond. When H-terminated diamond is exposed to air its resistance may decrease to approximately 5 to 7 $k\Omega sq^{-1}$ in a few hours and after which it increases to its original high resistance, greater than 10 $k\Omega sq^{-1}$, in approximately 4 days. $NO_2$ exposure can reduce the resistance to approximately 1.5 $k\Omega sq^{-1}$ in a few seconds. However, the resistance starts to increase when exposed to air, increasing to greater than 10 $k\Omega sq^-1$ in about 10 days. Resistance of doped $Al_2O_3$ decreases to approximately 2 $k\Omega sq^-1$ in the first 24 hours and may remain low for at least 120 days with no apparent increase of surface resistance.

Figure 8:
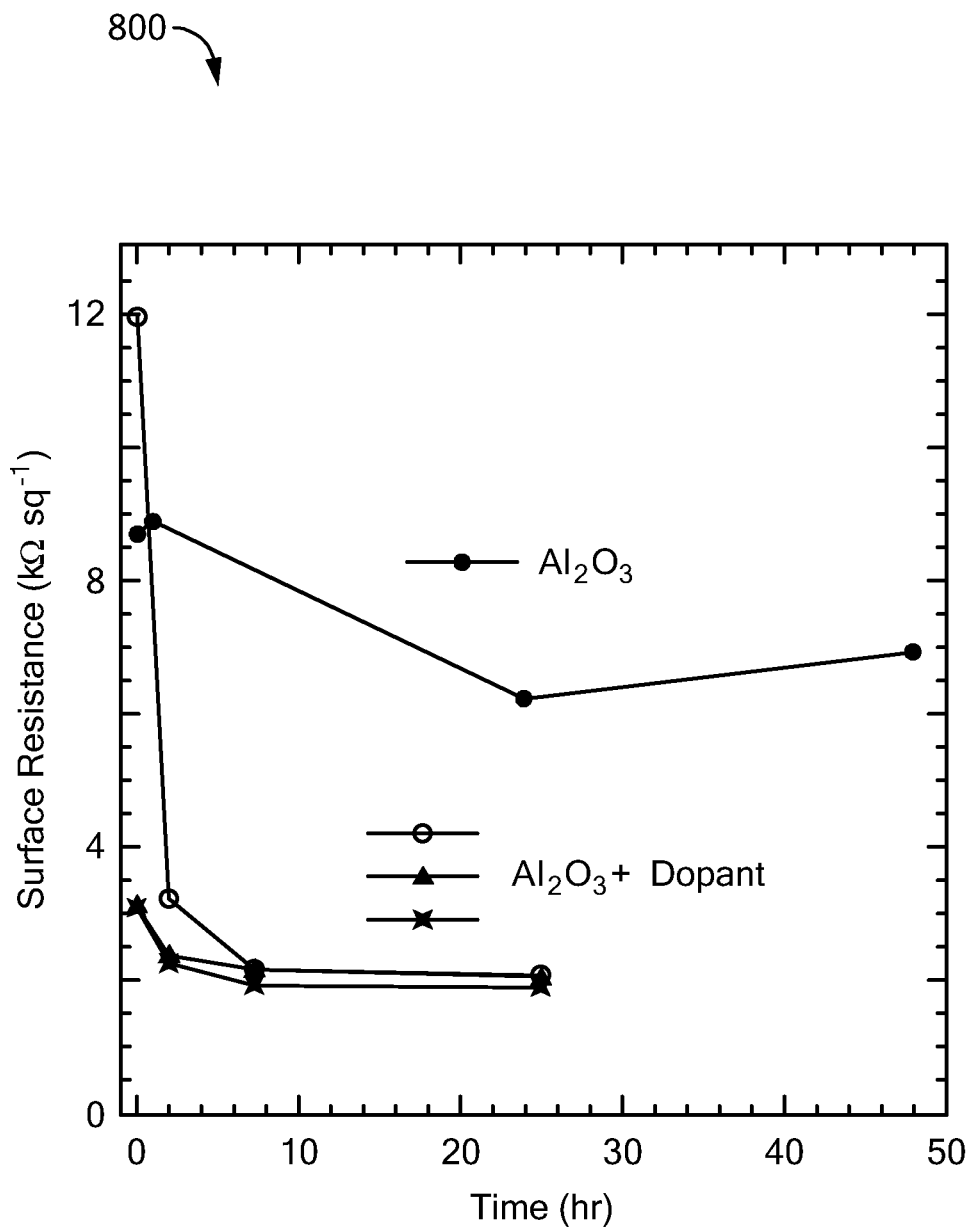
Figure 9:
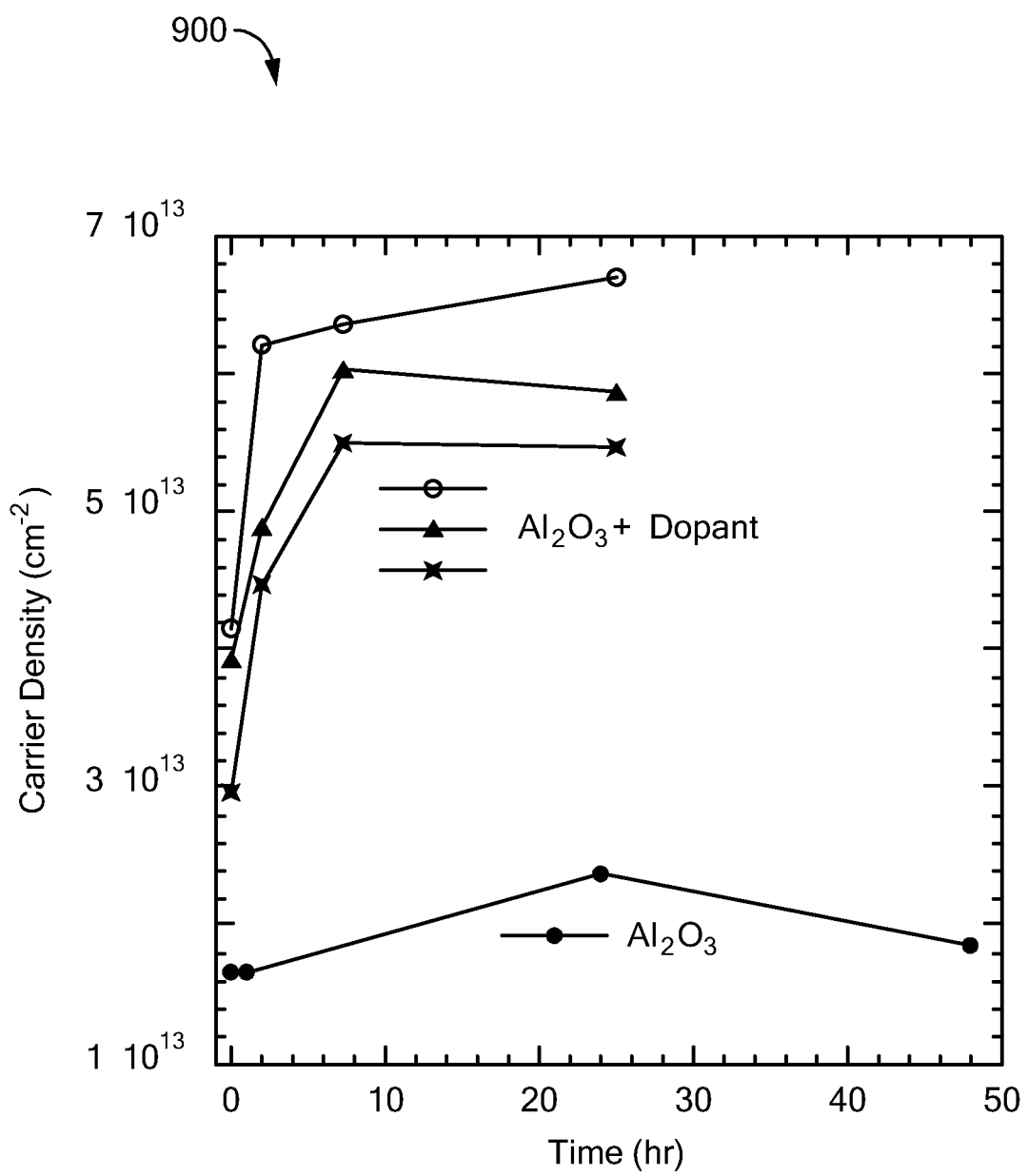

FIGS. 8 and 9 show the function of a dopant on the diamond's surface resistance with a doped $Al_2O_3$ matrix, according to embodiments of the disclosure, compared with an undoped $Al_2O_3$ matrix. In these comparisons, the mobility of holes in diamonds coated with undoped $Al_2O_3$ and those coated with doped $Al_2O_3$ are approximately the same, 50 $cm^2V^{-1} s^{-1}$. Thus, the increase in conductivity can be attributed to the increase in hole density in the diamond and the negative charge in the matrix.

Referring to FIG. 8, graph 800 illustrates the surface resistance of three diamond substrates coated with doped $Al_2O_3$ and one diamond substrate coated with undoped $Al_2O_3$. As can be seen, diamond substrates coated with doped $Al_2O_3$ may have a comparatively lower surface resistance.

Referring to FIG. 9, graph 900 illustrates the carrier density of three diamond substrates coated with doped $Al_2O_3$ and one diamond substrate coated with undoped $Al_2O_3$. As can be seen, diamond substrates coated with doped $Al_2O_3$ may have a comparatively higher carrier density. In some embodiments, mobility in diamond substrates coated with doped $Al_2O_3$ may range from 42 to 56 $cm^2V^{-1} s^{-1}$.

Having described exemplary embodiments, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method for stabilizing electrical properties of a diamond semiconductor, the method comprising:
   terminating a surface of a diamond with hydrogen (H) or deuterium (D) atoms; and
   over-coating the surface of the diamond with an encapsulating material comprising metal oxide salt doped with one or more elements capable of generating negative charge in the metal oxide salt.

2. The method of claim 1 wherein the metal oxide salt comprises aluminum oxide $(Al_2O_3)$ and the one or more elements capable of generating negative charge comprise at least one of silicon dioxide $(SiO_2)$ and/or zirconium oxide $(ZrO_2)$.

3. The method of claim 1 wherein the metal oxide salt comprises aluminum phosphate $(AlPO_4)$ and the one or more elements capable of generating negative charge comprise at least one of silicon dioxide $(SiO_2)$ and/or zirconium oxide $(ZrO_2)$.

4. The method of claim 1 wherein the metal oxide salt comprises boron oxide $(B_2O_3)$ and the one or more elements capable of generating negative charge comprise at least one of silicon dioxide $(SiO_2)$ and/or zirconium oxide $(ZrO_2)$.

5. The method of claim 1 wherein the encapsulating material comprises at least one of aluminum (Al) or boron (B), wherein, in the encapsulating material, the concentration of Al or B is less than that of the or more elements capable of generating negative charge.

6. The method of claim 1 wherein over-coating the surface of the diamond with the encapsulating material comprises using an evaporation process.

7. The method of claim 6 wherein the encapsulating material has a thickness of less than 2 nm.

8. The method of claim 6 wherein the evaporation process comprises:
   mounting the diamond to a vacuum system;
   heating the diamond to a temperature greater than 100° C.;
   wherein over-coating the surface of the diamond with the encapsulating material comprises:
      coating the surface of the diamond with at least one of Al or B using an evaporation technique;
      adding, to the surface of the diamond, the one or more elements capable of generating negative charge; and
      annealing the diamond in an oxidizing atmosphere to oxidize the Al or B and the one or more elements capable of generating negative charge.

9. The method of claim 8 wherein adding the one or more elements capable of generating negative charge occurs before coating the surface of the diamond.

10. The method of claim 8 wherein adding the one or more elements capable of generating negative charge occurs during coating of the surface of the diamond.

11. The method of claim 1 wherein over-coating the surface of the diamond with the encapsulating material comprises using an atomic layer deposition (ALD) process.

12. The method in claim 11 where, during the ALD process, the temperature of the diamond is increased from less than 300° C. to more than 350° C.

13. The method of claim 11 wherein the ALD process comprises:
   flowing argon (Ar) gas over the diamond;
   heating the diamond to a temperature of between 100 to 500 degrees Celsius;
   injecting alternating gas pulses into the argon gas;
   cooling the diamond semiconductor under argon gas; and
   annealing the diamond in an oxidizing atmosphere to oxidize the Al or B and the one or more elements capable of generating negative charge.

14. The method of claim 13 wherein the alternating gas pulses comprise:
   water ($H_2O$);
   an aluminium (Al) precursor; and
   a silicon dioxide ($SiO_2$) precursor.

15. The method of claim 13 wherein the Al precursor comprises trimethyl aluminum ($Al(CH_3)_3$)).

16. The method of claim 13 wherein the $SiO_2$ precursor comprises tris(tert-butoxy)silanol (($OC(CH_3)_3$)$_3$SiOH).

17. The method in claim 13 wherein the alternating gas pulses comprise a boron oxide ($B_2O_3$) precursor.

18. The method of claim 13 wherein the alternating gas pulses comprise a zirconium dioxide ($ZrO_2$) precursor.

19. The method of claim 13 wherein the alternating gas pulses comprise silicon dioxide ($SiO_2$) and a zirconium dioxide ($ZrO_2$) precursor.

20. The method of claim 13 wherein one or more steps of the ALD process occur within an ALD chamber, the method comprising:
   before placing the diamond in the ALD chamber, precoating the chamber with $SiO_2$ or $ZrO_2$ using a $SiO_2$ precursor or a $ZrO_2$ precursors, and an oxygen ($O_2$) plasma.

21. The method of claim 1 wherein over-coating the surface of the diamond with the encapsulating material comprises using a sol-gel spin coating process.

22. The method of claim 21 wherein the sol-gel spin coating process comprises:
   mixing an aluminum (Al) solution with a silicon ($SiO_2$) precursor solution;
   spin-coating the mixed solution onto the surface of the diamond with a surfactant to ensure wetting of the diamond surface with the sol-gel;
   heating the sol-gel to a temperature greater than 100° C.;
   annealing the diamond in an oxidizing atmosphere to oxidize the Al or B and the one or more elements capable of generating negative charge.

23. The method of claim 1 comprising over-coating the encapsulating material with a dielectric layer.

* * * * *